(12) United States Patent
Hsu

(10) Patent No.: US 7,474,563 B2
(45) Date of Patent: Jan. 6, 2009

(54) FLASH MEMORY, PROGRAM CIRCUIT AND PROGRAM METHOD THEREOF

(75) Inventor: Jer-Hao Hsu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 80 days.

(21) Appl. No.: 11/564,077

(22) Filed: Nov. 28, 2006

(65) Prior Publication Data

US 2008/0123427 A1    May 29, 2008

(51) Int. Cl.
*G11C 16/04* (2006.01)
(52) U.S. Cl. ................. 365/185.18; 365/185.2
(58) Field of Classification Search ............ 365/185.18, 365/185.2, 185.24
See application file for complete search history.

(56) References Cited

U.S. PATENT DOCUMENTS

| 5,684,741 | A | * | 11/1997 | Talreja ................. 365/185.22 |
| 5,867,427 | A | * | 2/1999 | Sato ...................... 365/185.2 |
| 6,094,374 | A | * | 7/2000 | Sudo ................... 365/185.22 |
| 6,111,791 | A |   | 8/2000 | Ghilardelli |
| 6,937,518 | B1 |   | 8/2005 | Park et al. |

* cited by examiner

*Primary Examiner*—Vu A Le
(74) *Attorney, Agent, or Firm*—J.C. Patents

(57) ABSTRACT

A program circuit and method for a flash memory is provided. This invention utilizes a constant current to program the flash memory and modulate the threshold voltage of the flash memory. While a program circuit programming the flash memory, the present invention determines whether the threshold voltage reaches the anticipated value according to the variation of the drain voltage of the flash memory. Hence, the present invention can accurately modulate the threshold voltage of the programmed flash memory and shorten the programming time.

15 Claims, 7 Drawing Sheets

FLASH MEMORY, PROGRAM CIRCUIT AND PROGRAM METHOD THEREOF

BACKGROUND OF THE INVENTION

1. Field of the Invention

The present invention relates to a program circuit for a flash memory. More particularly, the invention relates to a program circuit and a program method for the flash memory with a floating gate.

2. Description of Related Art

A flash memory has the feature of being light and non-volatile; therefore, it is commonly applied in portable devices, such as storage devices of mobile phones, MP3 players and digital cameras. Presently, the most extensively applied memory element in the flash memory is floating gate memory, whose structure is similar to that of a metal oxide semiconductor transistor, MOS, with a floating gate. In traditional technology, the way to program a floating memory usually is to set a high voltage potential between its control gate and drain, so as to trap electrons in the floating gate. The threshold voltage of the floating gate memory then fluctuates with the amount of electrons trapped in the floating gate. Therefore, there are two primary ways to program the floating gate memory. One is to fix the voltage of drain and change the voltage of control gate so as to create the necessary voltage difference, as the program method disclosed in the U.S. Pat. No. 6,111,791. However, the resistance-capacitance (RC) delay time of a word line is usually longer. It would require more time to program and cannot achieve the effect of rapid programming. The other way is to fix the voltage of control gate and change the drain voltage to create the necessary voltage difference, and determine the charge of the threshold voltage according to the current variation of the floating gate memory, such as the program method disclosed in the U.S. Pat. No. 6,937,518B1. Nevertheless, this method requires a gradual change in the drain voltage and a circuit for detecting current thereof. A charge pump is required to supply stable voltage and a current-detecting circuit is required to detect the current conducted in the flash memory; the current-detecting circuit is more difficult to realize and the needed chip area is larger. Furthermore, reliance on a sudden current drop to judge whether the programming status is finished will ensure bigger difference in the programmed element. It is more difficult to control the threshold voltage after programming, which would decrease the accuracy of the read result in the flash memory.

SUMMARY OF THE INVENTION

One aspect of this invention is to provide a flash memory. The program circuit of the flash memory utilizes a constant current to program the memory elements, which can reduce the complexity and cost of (charge pump) circuit design and shorten the time for programming.

One aspect of this invention is to provide a flash memory programming method, which utilizes a constant current and gate voltage to program the flash memory; hence, the specification requirements for an internal charge pump or external power source are lowered, and the threshold voltage after programming achieves higher concentration.

In order to achieve the foregoing and other aspects, the present invention provides a flash memory which includes a program unit, a detecting unit and a plurality of memory elements, each of the memory elements has a control terminal, a program terminal and a threshold and a threshold voltage. The program unit outputs a program current through an output node, wherein the node has a node voltage which is varied according to the threshold voltage. The detecting unit is coupled to the program unit and the memory element for detecting the node voltage, and blocking the program current once the node voltage exceeds a reference voltage.

In order to achieve the foregoing and other aspects, the present invention provides a program circuit for the flash memory, suitable for programming a memory array which has a plurality of memory elements. This program circuit includes a program unit, a detecting unit and switches. These switches are coupled between the detecting unit and the memory elements respectively to select the desired memory element for programming (such as, the first memory element and the second memory element).

While programming the first memory element, the word line voltage thereof is constant, and the program unit outputs a constant program current to the programmed memory element through the detecting unit, so as to modulate the threshold voltage of the programmed memory element. When the program voltage of the first memory element is higher than the reference voltage, the said detecting unit would stop conducting the program current to the first memory element.

Similarly, while programming the second memory elements, the program current is conducted to the second memory element by the switches, and whether the threshold voltage of the second memory elements has reached the anticipated voltage is determined by the program voltage of the second memory elements.

In order to achieve the foregoing and other aspects, the present invention provides a method for programming a flash memory element, which includes the following steps: First, provide a word line voltage to the control terminal of the flash memory element, and a program current is through a output node to the program terminal to modulate a threshold voltage of the flash memory element. Then, detect a node voltage of the output node and stop providing the program current when the node voltage exceeds a reference voltage.

The present invention applies a constant current and constant gate voltage to program the flash memory, and judge the change of the threshold voltage by the drain voltage of the flash memory. Hence, the present invention can accurately modulate the threshold voltage of the flash memory after programming operation, and reduce the complexity of the program circuit and lower the specification requirements for the internal charge pump or external power. Additionally, the present invention can adjust the threshold voltage to the necessary value in one-time programming, which greatly shortens the programming time.

In order to make the aforementioned and other aspects, features and advantages of the present invention more straightforward and comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
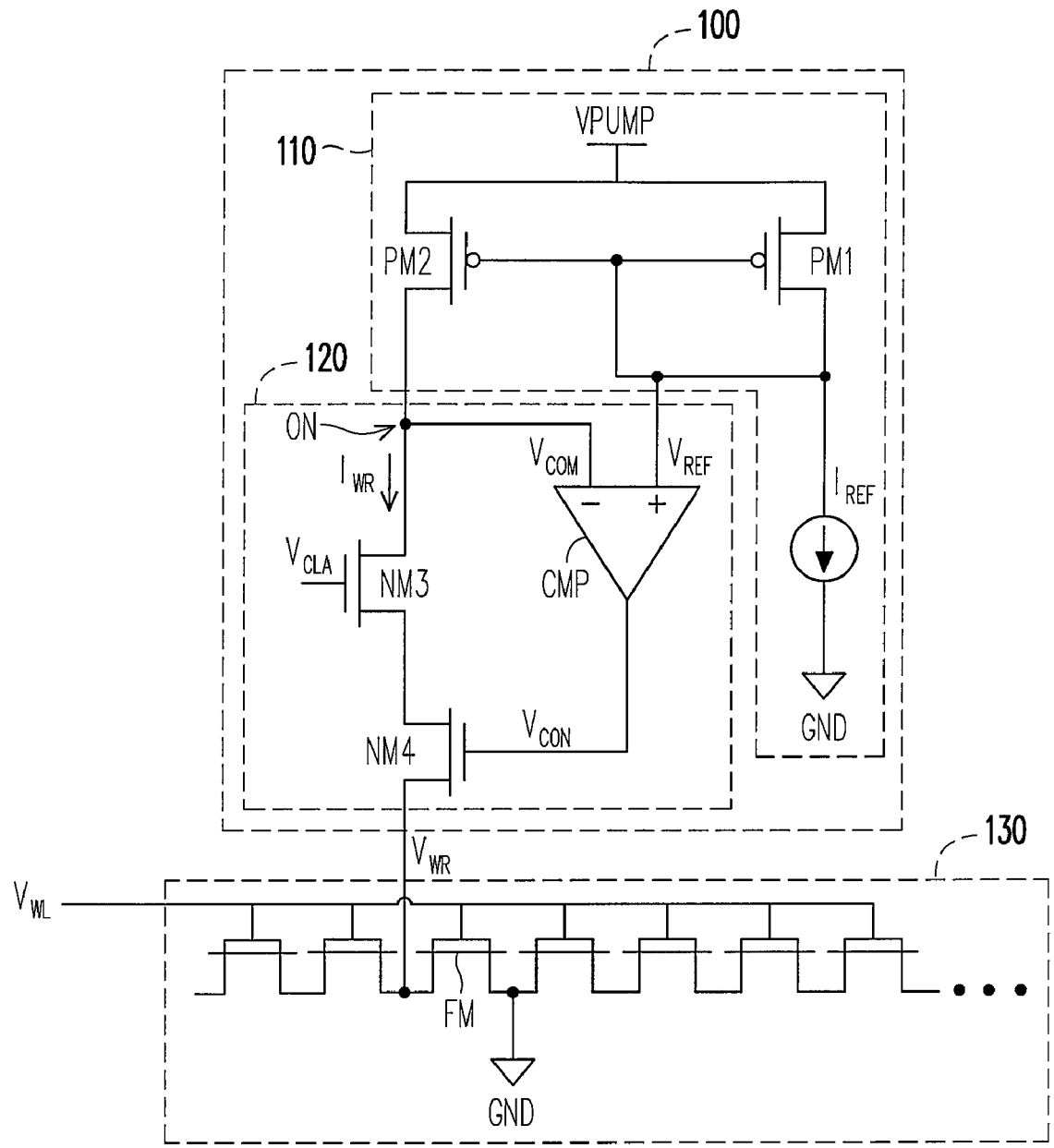
FIG. 1 is a diagram showing a program circuit for a flash memory according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram showing a program circuit for a flash memory according to one preferred embodiment of the present invention. Program circuit 100 includes a program unit 110 and a detecting unit 120, wherein the program Unit 100 is applied to program the memory element FM of a memory unit 130. In this embodiment, the memory element FM is a floating memory, i.e. one kind of flash memory. The control gate of the memory element FM connects a word line, and the word line can impose a word line voltage $V_{WL}$ on the control terminal (control gate) of the memory element FM.

The program circuit 100 is coupled to the program terminal (drain) of the memory element FM, and the source of the memory element FM is coupled to the ground terminal GND. During the programming process of memory element FM, the word line outputs the word line voltage VWL with a constant value to the control gate of memory element FM, and the program circuit 100 outputs the program current IWR with a constant value to the memory element FM.

At this time, the drain of the memory element FM generates a program voltage $V_{WR}$ (i.e. drain voltage) according to the values of a program current $I_W$ and word line Voltage $V_{WL}$. In other words, the required voltage potential for programming the memory element FM is generated from the drain-source and gate-source voltage of memory element FM. When the threshold voltage of memory element FM fluctuates (higher threshold voltage) because the trapped electrons of the floating gate cause variation, the program voltage $V_{WR}$ increases accordingly to maintain the equivalence between the current conducted by the memory element FM and the program current $I_{WR}$. Therefore, the program voltage $V_{WR}$ is relevant to the threshold voltage of the memory element FM. The program circuit 100 can infer the threshold voltage of the memory element FM by variation in the program voltage $V_{WR}$. When program voltage $V_{WR}$ reaches the expected value, it means that the programming process of the memory element FM is completed.

The present invention judges whether the threshold voltage of memory element FM achieves the necessary pre-set value by the control gate voltage, drain voltage and conductive current of the memory element FM. Consequently, even if variation in the fabricating process cause feature differences among various memory elements, their threshold voltages should become more approximate once the programming operation is executed in the way disclosed in the present invention. The threshold voltage can be modulated to the necessary value in one time programming operation instead of multiple programming operations, which can notably reduce the programming time of the flash memory. In the meantime, the present invention requires only a constant program current and word line voltage to perform programming, hence the cost for realizing the circuit structure is lower and the necessary voltage for programming operation can be easily provided by a simpler charge pump.

Next, the circuit structure of the program circuit 100 is further explained. The program current $I_{WR}$ output by the program circuit 100 is supplied by the program unit 110. The detecting unit 120 is responsible for detecting the program voltage $V_{WR}$. The major structure of the program unit 110 is a current mirror, mainly comprises PMOS transistors (PMOS transistors) PM1, PM2 and a current source $I_{REF}$. PMOS transistor PM1 is coupled with the operating voltage VPUMP and the current source $I_{REF}$, while the PMOS transistor PM2 is coupled between the operating voltage VPUMP and the detecting unit 120. The PMOS transistor PM1 is coupled with the gate of the PMOS transistor PM2, and the gate of PMOS transistor PM1 is coupled as well with the common node of the PMOS transistor PM1 and the current source $I_{REF}$. Among them, the PMOS transistor PM2 outputs the corresponding program current $I_{WR}$ according to the current source $I_{REF}$ and the common node of the PMOS transistor PM1 and the current source $I_{REF}$ outputs the reference voltage $V_{REF}$.

The operating voltage VPUMP can be supplied by the exterior power source or internal charge pump. The program circuit 100 requires only a necessary operating voltage VPUMP and constant current from the charge pump, so it does not need additional specifically designed charge pumps to execute the programming operation of the memory element FM.

The detecting unit 120 mainly comprises the NMOS transistors NM3, NM4 and a comparator CMP. The NMOS transistor NM3 and NM4 are serially connected and coupled between the PMOS transistor PM2 and the drain of the memory element FM. The gate of the NMOS transistor NM3 is coupled to a clamp voltage $V_{CLA}$, while the gate of NMOS transistor NM4 is coupled to the output terminal of the comparator CMP. The positive input terminal of a comparator COM is coupled to the common node of the PMOS transistor PM1 and the current source $I_{REF}$, while the negative input terminal of the comparator COM is coupled to the output node ON of the program unit 110. The program unit 110 outputs a node voltage $V_{COM}$ form the output node ON and the comparator COM outputs a control voltage $V_{CON}$ to the gate of the NMOS transistor NM4 based on the node voltage $V_{COM}$ and the reference voltage $V_{REF}$, wherein the control voltage $V_{CON}$ is logic high when programming the memory element. The control voltage $V_{CON}$ is substantially equal to the operating voltage VPUMP when the control voltage $V_{CON}$ is logic high and equal to ground voltage when the control voltage $V_{CON}$ is logic low.

While programming the memory element FM, the clamp voltage $V_{CLA}$ is a stable analog voltage level to conduct the NMOS transistor NM3, and the program current $I_{WR}$ passes from the NMOS transistor NM3, NM4 to the memory element FM. The node voltage $V_{COM}$ is related to the program voltage $V_{WR}$ of the memory element FM and the drain-source voltages of the NMOS transistors NM3 and NM4, wherein the program voltage $V_{WR}$ varies with the threshold voltage of the memory element FM. When the program voltage $V_{WR}$ rises, the gate-source voltages of the NMOS transistors NM3 and NM4 are reduced, hence the drain-source voltages of the transistors NM3 and NM4 will be increased for maintaining the current conducted by the NMOS transistors NM3 and NM4 to equal to the program current $I_{WR}$.

If the threshold voltage of the memory element FM does not reach the desired value yet, the node voltage $V_{COM}$ would be lower than the reference voltage $V_{REF}$ and the control voltage $V_{CON}$ maintains at a high level to conduct NMOS transistor NM4. When the threshold voltage of the memory element FM elevates as the programming proceeds and reaches the desired value, the program voltage $V_{WR}$ also rises to increase the node voltage $V_{COM}$ which is higher than the reference voltage $V_{REF}$. At this moment, the comparator COM outputs a low level control voltage $V_{CON}$ to shut down the NMOS transistor NM4, and the detecting unit 120 stops conducting the program current $I_{WR}$ to the memory element FM. The difference in the threshold voltage of the memory element FM can equip memory element FM with a memory function of Logic 1 and Logic 0.

During the programming operation of the memory element FM, The word line voltage $V_{WL}$ and program current $I_{WR}$ are both constant. By setting a different word line voltage $V_{WL}$ and a different program current $I_{WR}$, the programming speed and the threshold voltage of the memory element FM after programming can be changed. The word line voltage $V_{WL}$ and the program current $I_{WR}$ can be determined according to different memory element specifications or fabricating conditions. Additionally, the threshold voltage of the memory element FM can be adjusted by setting the clamp voltage $V_{CLA}$. Applications can also be easily deduced by those of ordinary skills in the art according to the disclosure of the present invention, and will not be described herein again.

Figure 2:
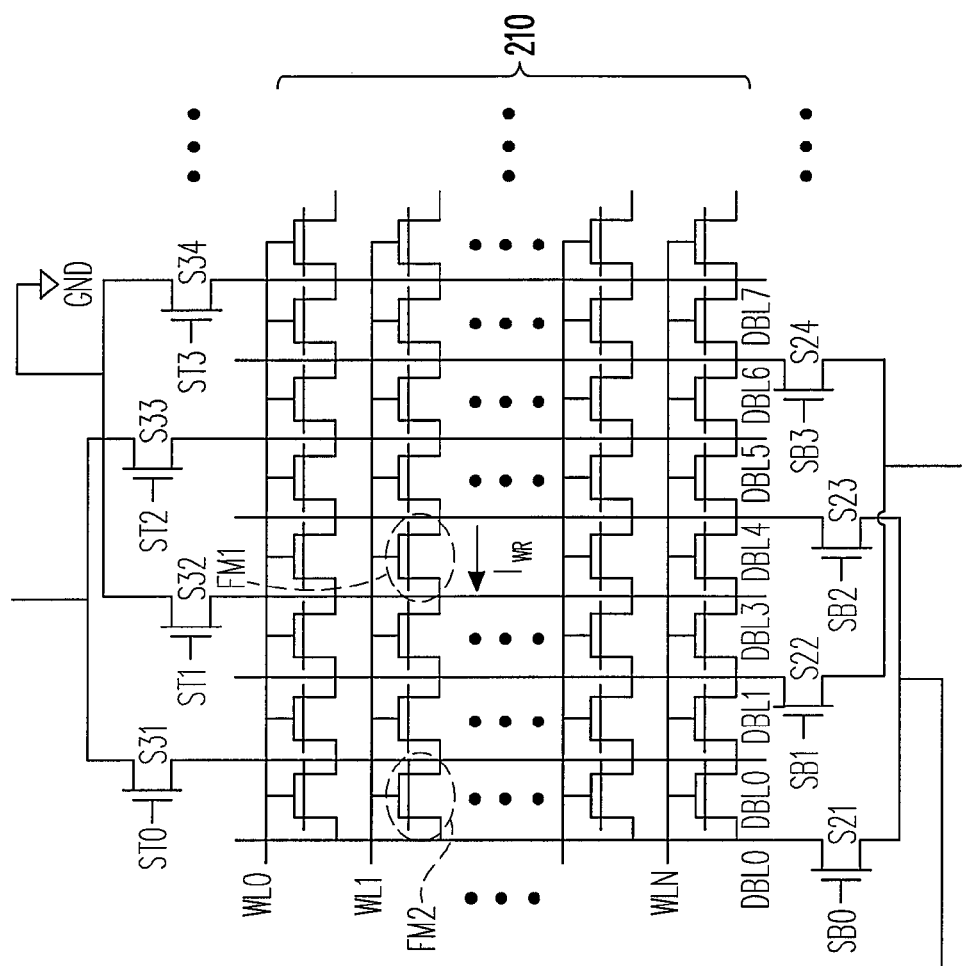
FIG. 2 is a diagram of a program circuit for a flash memory according to another preferred embodiment of the present invention.
Figure 2:
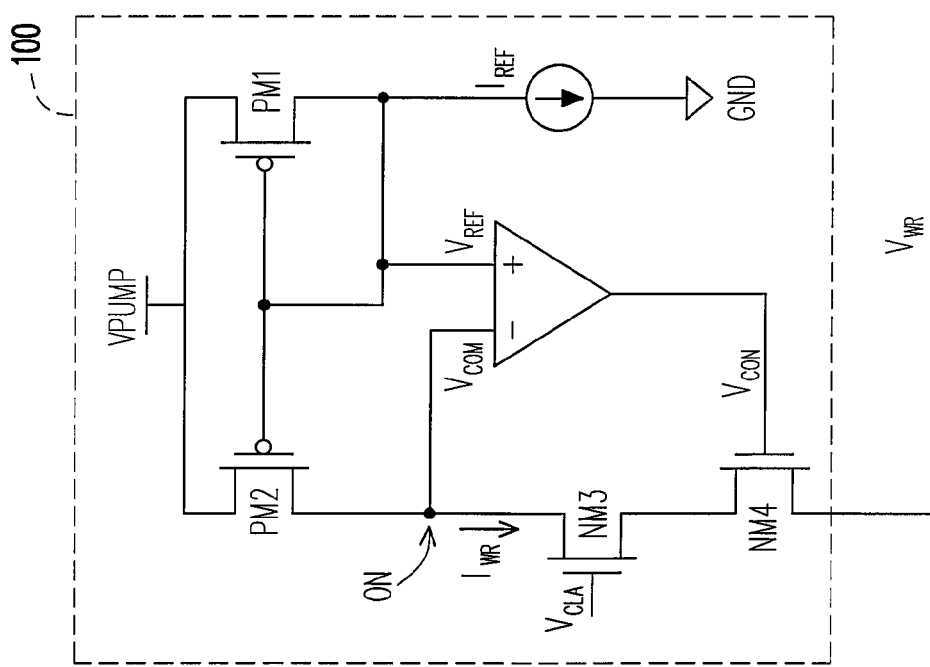

Furthermore, the program circuit of this invention can also apply to the programming of a memory array. It only requires adding switches between a program circuit and a memory array to select the desired memory element for programming. FIG. 2 is a diagram of a program circuit for a flash memory according to another preferred embodiment of the present invention. A memory array 210 includes a plurality of memory elements arranged in arrays; each row of memory elements corresponds to a word line, each column to a bit line. The word lines WL0~WLN control the control gate voltage of all the memory elements, while bit lines DBL0~DBL7 control the source voltage and drain voltage of the first seven rows of memory elements. The rest can be inferred likewise.

The program circuit 100 is coupled to the bit lines DBL0 and DBL4 through the switches S21 and S23 (composed of the NMOS transistors). Through the turn-on status of the switches S21 and S23 along with the word line voltage output by the word lines WL0~WLN, the desired memory elements for programming can be thus selected. In the present embodiment, take a memory element FM1 for example, the word line WL1 outputs a high level word line voltage, and the select signals ST1 and SB2 of the bit lines DBL3 and DBL4 enables to turn on the switches S32 and S23. The program circuit 100 conducts the program current $I_{WR}$ to the drain of the memory element FM1 through the switch S23, so as to program the memory element FM1 while the source of the memory element FM1 is coupled to ground terminal GND through the switch S32. If programming the memory element FM2 is desired, all that is required is turning on switches S21 and S31 and outputting a proper word line voltage on the corresponding word line WL1.

In another embodiment of the present invention, the program circuit 100 can be coupled to different bit lines as well (like the bit line DBL2 and DBL6) to program different memory elements through different switches (such as switches S22 and S24). During programming operation, the drain of the selected memory element (such as memory element FM1) would output program voltage $V_{WR}$ through the switch S23 to the output terminal of the program circuit 100. Likewise, as the threshold voltage of the memory element FM1 fluctuates, the program voltage $V_{WR}$ changes as well. When the program voltage $V_{WR}$ corresponds to the reference voltage $V_{REF}$ (attainable through comparison between node voltage $V_{COM}$ and reference voltage $V_{REF}$), it means the programming operation is completed and the program circuit 100 would stop outputting the program current $I_{WR}$.

As to the arrangement of the memory array 210, there still exist various different layouts, but the principles are similar. As long as the desired memory element for programming can be selected through a word line and a bit line, the program circuit in this embodiment can apply therein. Applications can be easily deduced by those of ordinary skills in the art according to the disclosure of the present invention, and will not be described herein again.

In another embodiment of the present invention, the program circuit 100 can also program different memory elements sequentially. Let us take memory elements of the same word line (like FM1 and FM2) as examples and respectively name them first memory element and second memory element. During programming operation of the memory element FM1 and FM2, the program circuit 100 outputs the program current $I_{WR}$ to program the memory element FM2 when switches S21, S31 are on and to program the memory element FM1 when switches S23, S32 are on. In other words, the program circuit 100 can program different memory elements sequentially by disposing corresponding switches. In another embodiment of the present invention, a plurality of program circuit can be disposed to program memory elements simultaneously and shorten the time for programming flash memory.

Figure 3:
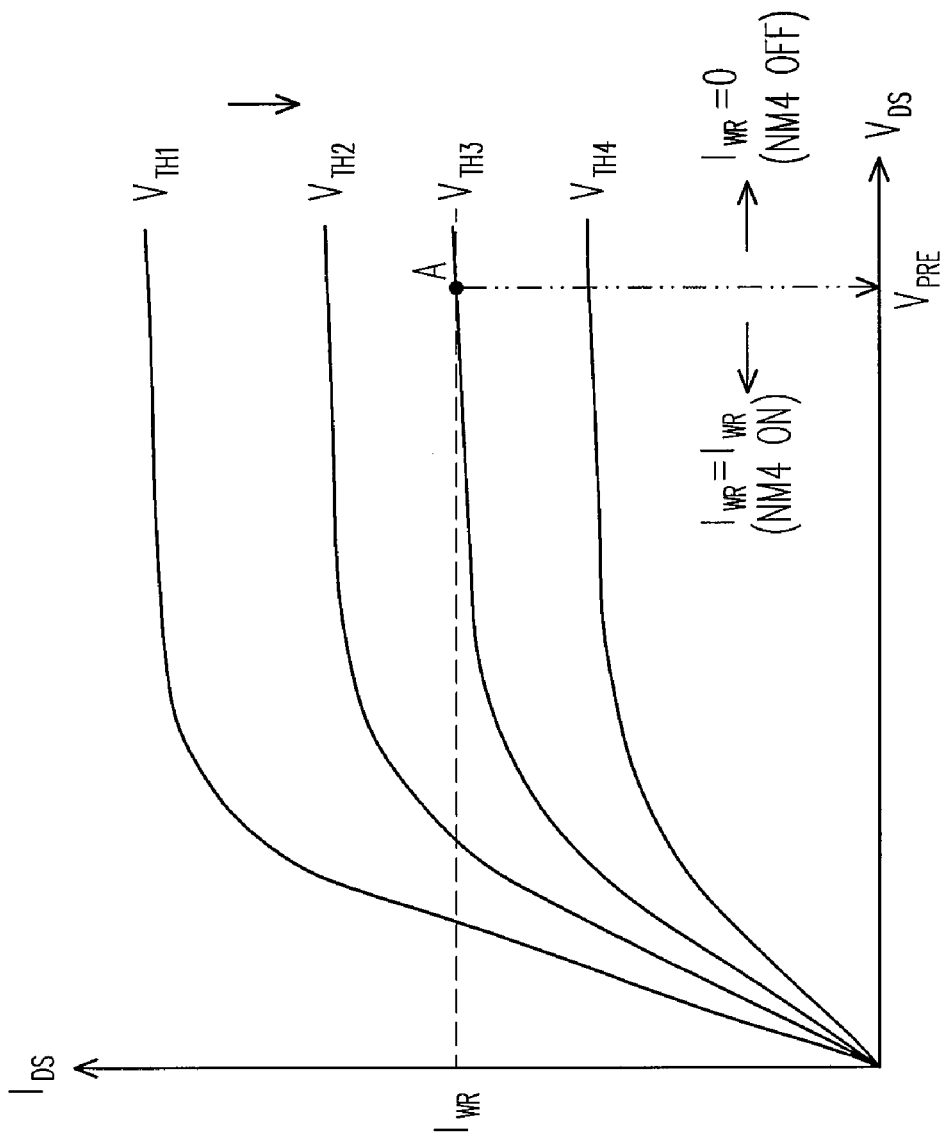
FIG. 3 is a waveform diagram showing the features of a program circuit and a memory element in another preferred embodiment of the present invention.

Next, the technical means of this invention are further illustrated in waveforms. FIG. 3 is a waveform showing the features of a program current and a memory element in another embodiment of the present invention. The IV features of a memory element are shown in a schematic diagram as in FIG. 3. The vertical axis represents a conduction current IDS, while the horizontal axis represents a drain-source voltage $V_{DS}$ (the voltage potential from the drain to the source) of a memory element. The control voltage of a memory element is equal to the word line voltage; hence, under the same gate-source voltage, if a threshold voltage gets higher, the conduction current $I_{DS}$ gets lower. Therefore, Threshold Voltage $V_{TH1}<V_{TH2}<V_{TH3}<V_{TH4}$. During the programming operation, the threshold voltage gradually elevates. Since the conducted current in a memory element must be equal to the program current $I_{WR}$, so as to the drain-source voltage $V_{DS}$ thereof has to varies with the threshold voltage accordingly. In this embodiment, the anticipated threshold voltage is $V_{TH3}$.

Consequently, when the drain-source voltage $V_{DS}$ of memory element FM (i.e. the forgoing program voltage in the caption of FIG. 1) reaches a pre-set voltage $V_{PRE}$ (i.e. the point A in FIG. 3), it means the threshold voltage of the memory element has been modulated to the anticipated threshold voltage $V_{TH3}$, wherein the pre-set voltage $V_{PRE}$ is equal to $(V_{CLA}-V_{GS3}-V_{IR-drop})$, the $V_{CLA}$ presents the clamp voltage, the $V_{GS3}$ presents the gate-source voltage of the NMOS transistor NM3, the $V_{IR-drop}$ presents the IR drop form the parasitic resistance of the current path and drain-source voltage of NMOS transistor NM4. At this moment, the program current $I_{WR}$ would drop to zero and thus shut down the NMOS transistor NM4. Please refer to FIG. 1 with the following explanation. In this embodiment, a reference voltage can be based upon to determine whether the drain-source voltage $V_{DS}$ has reached the pre-set voltage $V_{PRE}$. Setting different clamp voltages can result in different Drain-Source Voltage VDS, and generate different threshold voltages in programmed memory elements.

Figure 4A:
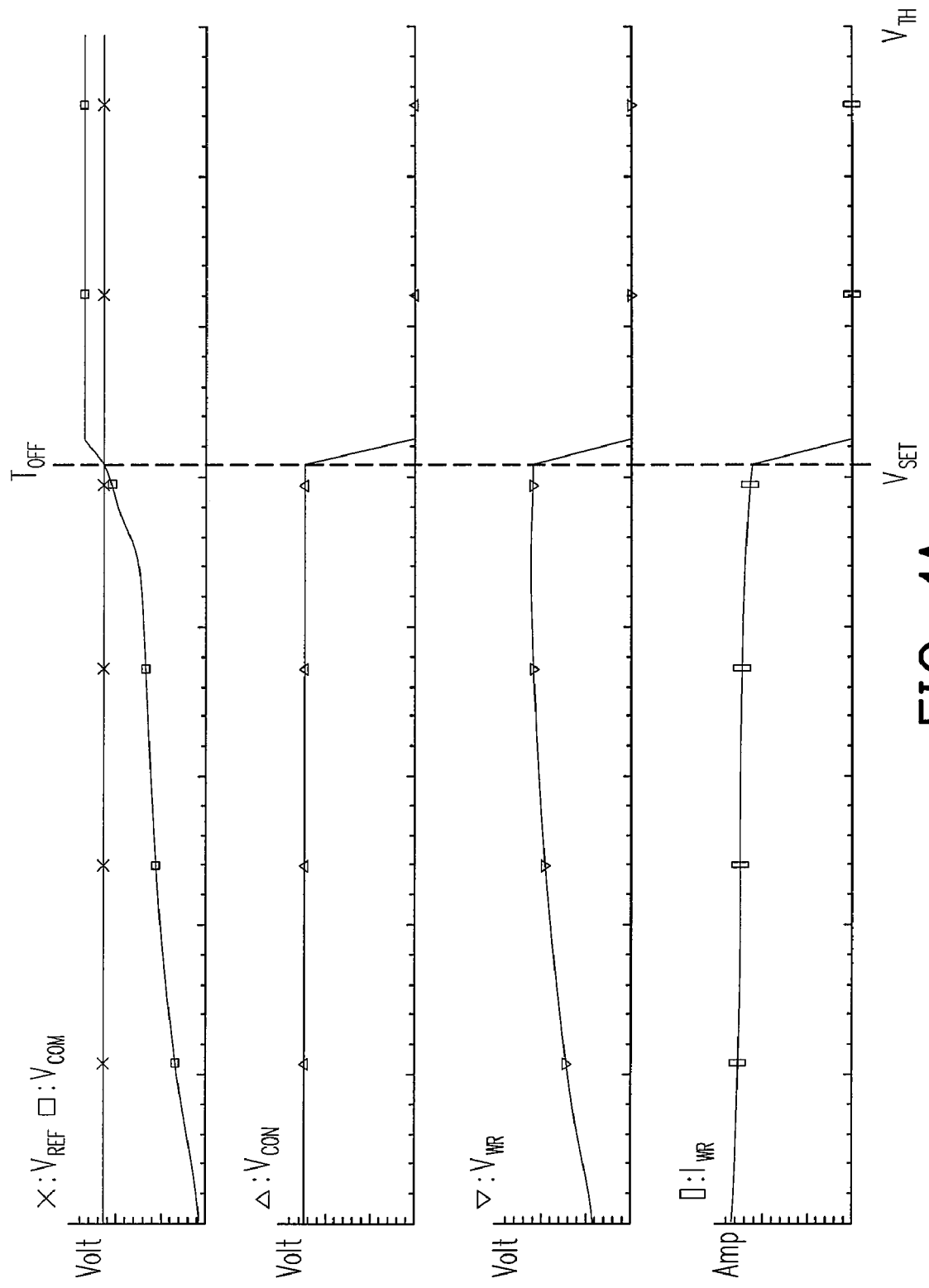
FIG. 4A~4C are diagrams showing the waveforms of signal simulation in other preferred embodiments of the present invention.
Figure 4B:
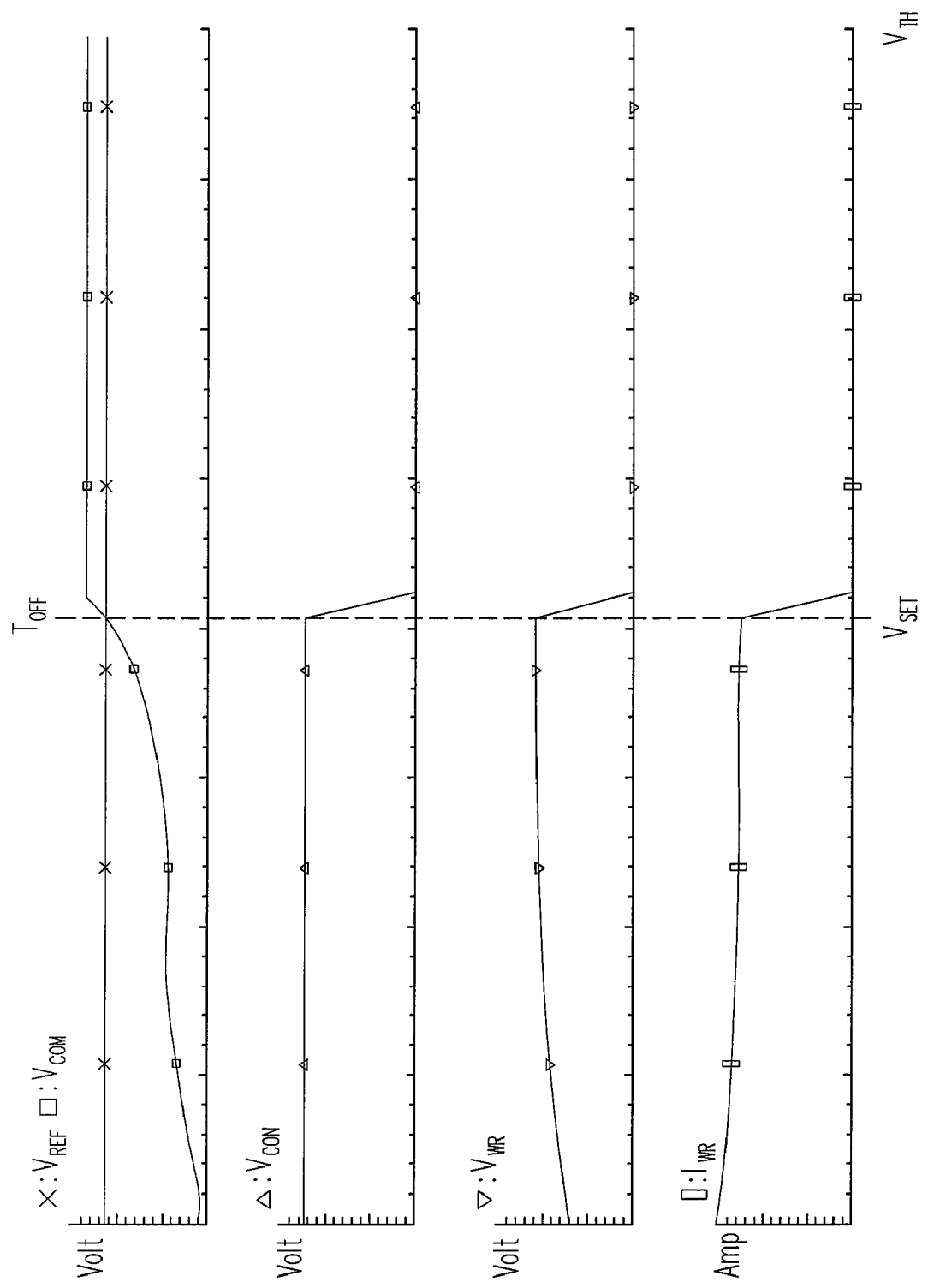
Figure 4C:
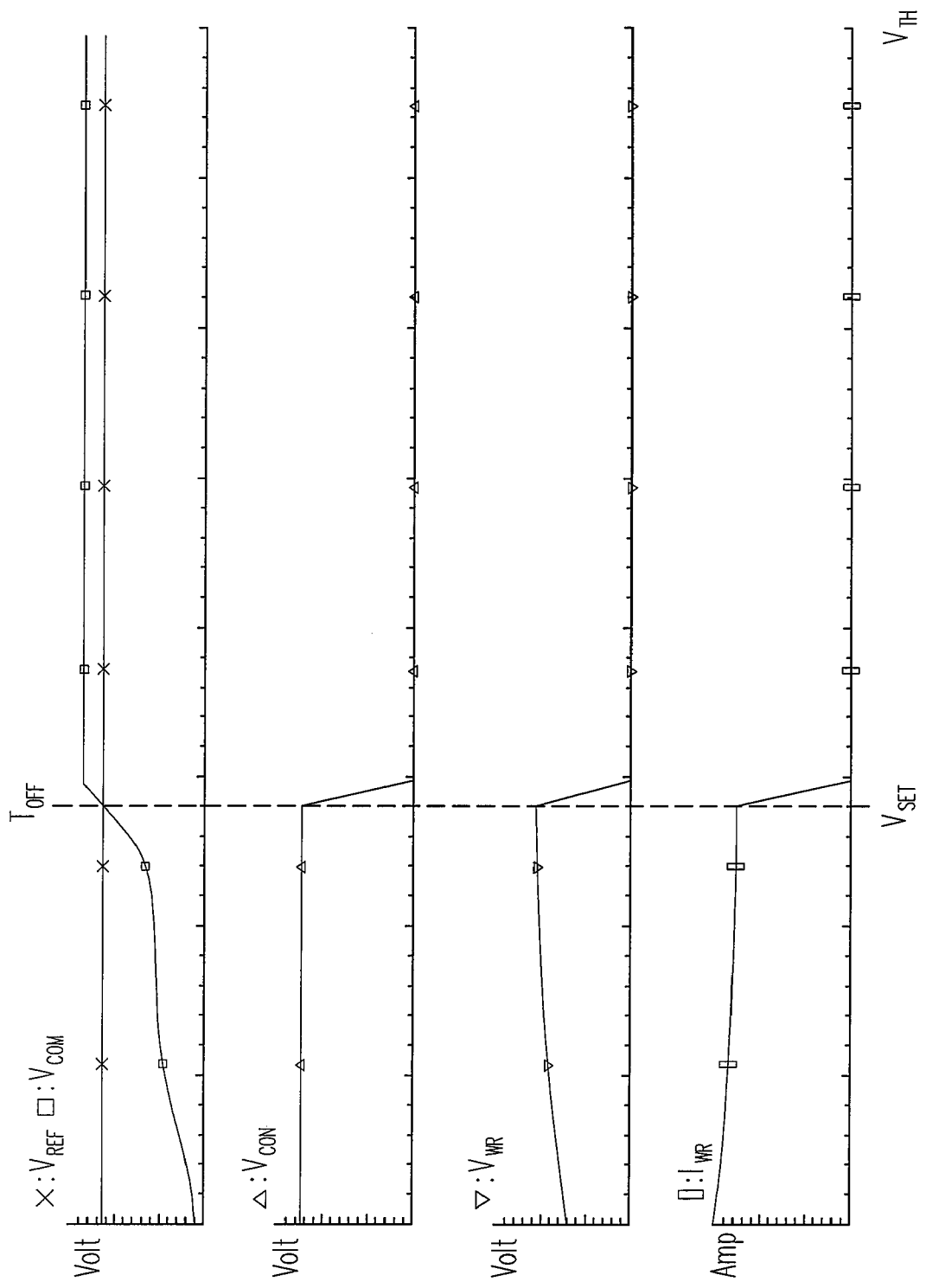

FIG. 4A~4C are diagrams showing the waveforms of signal simulation in other embodiments of the present invention.

Please refer to FIG. 1 with the following explanation. As shown in FIG. 4A, during the programming operation in memories, the reference voltage $V_{REF}$ is set at a constant level; the node voltage $V_{COM}$ varies with the program voltage $V_{WR}$. The program current $I_{WR}$ has a set level (60 μA in the FIG. 4A, 70 μA in the FIG. 4B, 80 μA in the FIG. 4C), but it may drop slightly due to variation in node voltage $V_{COM}$ because the drain voltage of the PMOS transistor PM2 gets affected. When the threshold voltage $V_{TH}$ rises due to programming operation, the program voltage $V_{WR}$ would rise; the node voltage $V_{COM}$ also increases accordingly with the program voltage $V_{WR}$ raises.

When the node voltage $V_{COM}$ is higher than the reference voltage $V_{REF}$, which means after a point of time $T_{OFF}$ (i.e. when the threshold voltage $V_{TH}$ of the memory element is reach the desired threshold voltage $V_{SET}$), the comparator COM immediately converts and outputs the low level control voltage $V_{CON}$. The NMOS transistor NM4 then shuts down immediately as well. The program current $I_{WR}$ and the program voltage $V_{WR}$ also drop rapidly, and meanwhile finish programming of the memory element, wherein the higher the program current $I_{WR}$ is, the shorter the time of programming operation in the memory element is.

Figure 5:
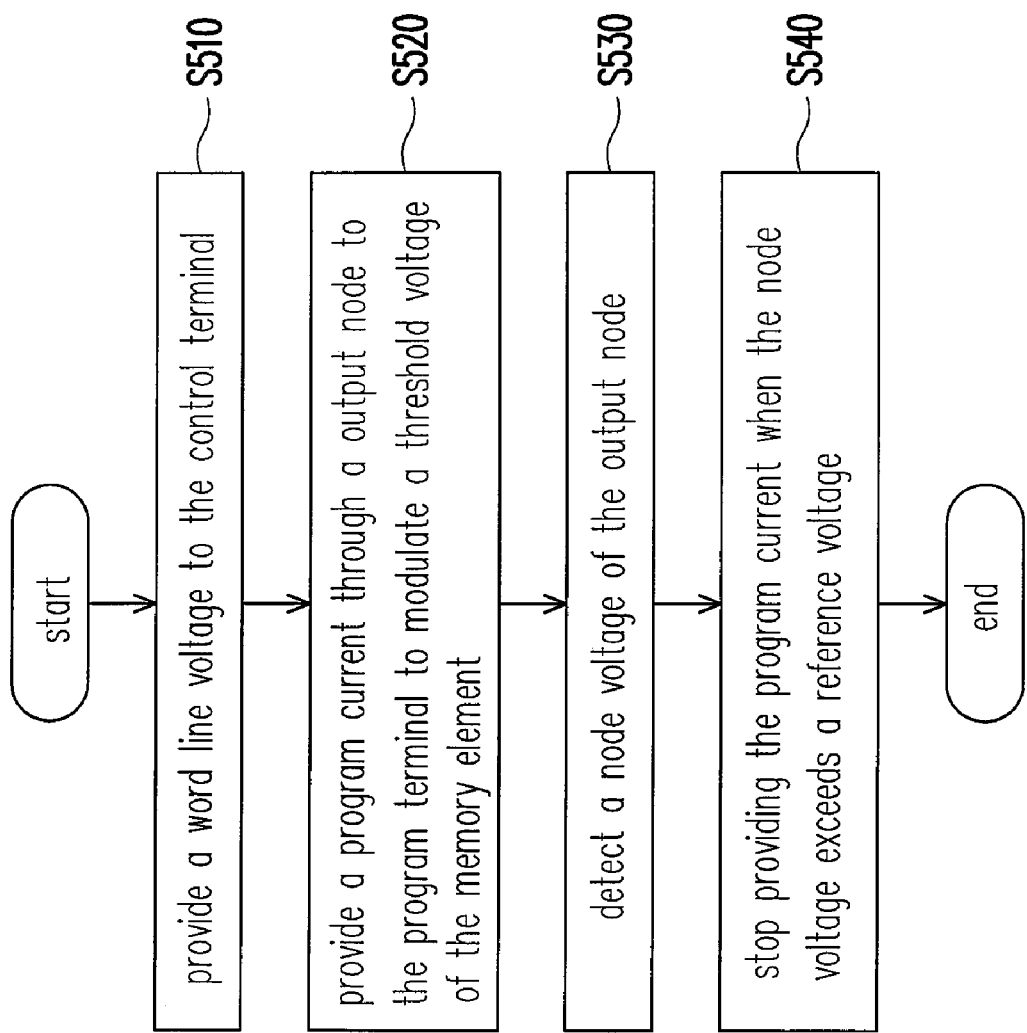
FIG. 5 is a flow chart of a program method for a flash memory according to another preferred embodiment of the present invention.

From another viewpoint, this invention also provides a program method for the flash memory. FIG. 5 is the flow chart drawn according to the program method for the flash memory in another embodiment of the invention. It includes the steps as follows: First, in Step S510, provide a word line voltage to the control terminal of the memory element; the word line voltage is set at a constant value. If the memory element is a floating gate memory, the control terminal thereof is the control gate of the floating gate memory. Then, in Step S520, provide a program current through an output node to the program terminal of the memory element to modulate the threshold voltage of the memory element and set the program current at a constant value. In Step S530, detect a node voltage of the output node, such as detecting the drain voltage of the floating gate memory. Next in Step S540, stop providing the program current to the memory element when the node voltage exceeds the reference voltage, and complete programming the memory element. Since it is under a constant program current, the program voltage of the floating gate memory fluctuates with the threshold voltage. Therefore, when the node voltage exceeds the reference voltage, it means the threshold voltage of the floating gate memory has reached the anticipated threshold voltage value.

In another embodiment of this invention, if pluralities of memory elements are required to be programmed, as set forth in Step S510, supply simultaneously the word line voltage to the rest of the selected memory elements for programming. In coordination with Steps S520 and S530, switch the program current to program selected memory element and detect the program voltage thereof. When the node voltage exceeds the reference voltage, stop outputting the program current to the selected memory elements. The other details of the program method of this embodiment have all been described in detail in the embodiments of the above-mentioned FIG. 1~4C, which are not to be repeated herein.

The invention applies a constant current and a constant gate voltage to program the flash memory, and determines the change of the threshold voltage of the flash memory according to the drain voltage of the flash memory. Thus, the circuit structure of the present invention is easier to realize and the design cost thereof lower, and it can accurately modulate the threshold voltage after programming the flash memory. At the same time, the specification requirements of an exterior charge pump can be lowered since no fine tuning in voltage is needed to proceed with the programming operation. The threshold voltage can be modulated to the necessary value in one time programming operation instead of multiple time programming operation, which can notably reduce the programming time.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A flash memory comprising:
   a plurity of memory elements, each having a control terminal, a program terminal and a threshold voltage;
   a program unit having an output node, wherein the program unit outputs a program current through the output node, and wherein the node has a node voltage; and
   a detecting unit, coupled to the program unit and the memory element for detecting the node voltage, and blocking the program current once the node voltage exceeds a reference voltage,
   wherein the detecting unit comprises:
   a first NMOS transistor and a second NMOS transistor, the first NMOS transistor and the second NMOS transistor coupled between the second PMOS transistor and the memory element, and the gate of the first NMOS transistor connected to a clamp voltage; and
   a comparator, a positive input terminal of the comparator coupled to the common node of the first PMOS transistor and the current source, and a negative input terminal of the comparator connected to the common node of the first NMOS transistor and the second PMOS transistor and outputting a control voltage to the gate of the second NMOS transistor.

2. The flash memory of claim 1, wherein the program unit comprises:
   a current mirror, for outputting the program current.

3. The flash memory of claim 2, wherein the program unit comprises:
   a first PMOS transistor, coupled to an operating voltage source and a current source; and
   a second PMOS transistor, coupled to the operating voltage source and the detecting unit, and the gate of the first PMOS transistor coupled to the gate of the second PMOS transistor and the common node of the first PMOS transistor and current source;
   wherein the second PMOS transistor outputting the program current according to the current source, and the common node of the PMOS transistor and the current source outputting the reference voltage.

4. The flash memory of claim 1, wherein the detecting unit comprises:
   a first NMOS transistor, one terminal of the first NMOS transistor coupled to the program unit, and the common node of the first NMOS transistor and the program unit outputting the node voltage, and the gate of the first NMOS transistor coupled to a clamp voltage;
   a second NMOS transistor, coupled between the first NMOS transistor and the memory element, and
   a comparator, a positive input terminal of the comparator connected to the reference voltage, and a negative input terminal of the comparator connected to the node voltage, and the output terminal of the comparator coupled to the gate of the second NMOS transistor;

wherein the program unit outputting the program current to the memory element through the first NMOS transistor and the second NMOS transistor so that the node voltage corresponding to the program voltage, and the comparator outputting a control voltage to the second NMOS transistor, and when the node voltage is higher than the reference voltage, the comparator turns off the second NMOS transistor.

5. The flash memory of claim 1, wherein the memory element comprising a floating gate memory, the drain of the floating gate memory coupled to the detecting unit and outputting the program voltage, and the gate of the floating gate memory coupled to a word line for receiving the word line voltage, and the drain of the floating gate memory as the program terminal of the memory element, and the control gate of the floating gate memory as the control terminal of the memory element.

6. A program circuit for the flash memory, for programming a memory array having a plurality of memory elements, said program circuit comprising:

a program unit, for outputting a program current and a reference voltage; and a detecting unit, coupled to said program unit for conducting said program current to a first memory element of said memory elements and detecting a program voltage outputted from the memory elements; and a plurality of switches, coupled to the detecting unit and the memory elements for selecting the first memory element;

wherein a word line voltage outputted to the first memory element during programming the first memory element and the program unit outputting a program voltage to the first memory element through said detecting unit for modulating the threshold voltage of the first memory element, and when the node voltage is higher than the reference voltage, the detecting unit stopping conducting the program current to said first memory element; and wherein the detecting unit comprises:

a first NMOS transistor, coupled to the second PMOS transistor;

a second NMOS transistor, coupled to the first NMOS transistor and the memory element, and the gate of the first NMOS transistor coupled to a clamp voltage; and a comparator, the positive input terminal of the comparator coupled to the common node of the first PMOS transistor and the current source, and the negative input terminal of the comparator connected to the common node of the first NMOS transistor and the second PMOS transistor and outputting a control voltage to the gate of the second NMOS transistor.

7. The program circuit for the flash memory of claim 6, wherein the program unit comprises:

a current mirror, for outputting the program current.

8. The program circuit for the flash memory of claim 7, wherein the current mirror comprises:

a first PMOS transistor, coupled to an operating voltage and a current source; and a second PMOS transistor, coupled to the operating voltage source and the detecting unit; the gate of the first PMOS transistor coupled to that of the second PMOS transistor and the common node of the first PMOS transistor and the current source;

wherein the second PMOS transistor outputting the corresponding program current according to the current source, and the common node of the first PMOS transistor and the current source outputting the reference voltage.

9. The program circuit for the flash memory of claim 6, wherein the detecting unit comprises:

a first NMOS transistor, one terminal of the first NMOS coupled to the program unit, and the common node of the first NMOS transistor and the program unit outputting the node voltage, and the gate of the first NMOS transistor coupled to a clamp voltage;

a second NMOS transistor, coupled to the first NMOS transistor and the memory element, and a comparator, the positive input terminal of the comparator coupled to the reference voltage and the negative input terminal of the comparator coupled to the node voltage, and the output terminal of the comparator coupled to the gate of the second NMOS transistor;

wherein the program unit outputting the program current to the memory element through the first NMOS transistor and the second NMOS transistor, so that the node voltage corresponding to the program voltage; the comparator outputting a control voltage to the second NMOS transistor, and when the node voltage is higher than the reference voltage, the comparator turns off the second NMOS transistor.

10. The program circuit for the flash memory of claim 6, wherein the memory element comprises a floating gate memory, the drain of the floating gate memory coupled to the detecting unit and outputting the program voltage, and the source terminal of the floating gate memory coupled to a ground terminal, and the gate of the floating gate memory coupled to a word line for receiving the word line voltage, and the drain of the floating gate memory as the program terminal of the memory element.

11. A method for programming a flash memory element having a control terminal and a programming terminal, comprising the following steps:

providing a word line voltage to the control terminal;

providing a program current with a constant value through a output node to the program terminal to modulate a threshold voltage of the memory element;

detecting a node voltage of the output node; and stopping providing the program current when the node voltage exceeds a reference voltage.

12. The method of claim 11, wherein the flash memory element comprises a floating gate memory, the drain of the floating gate memory coupled to the detecting unit outputting the program voltage, and the source terminal of the floating gate memory coupled to a ground terminal, and the gate of the floating gate memory coupled to a word line receiving the word line voltage, and the drain thereof as the programming terminal of the memory element.

13. The method of claim 12, wherein a word line voltage outputted to the control terminal of a memory element comprising outputting the word line voltage to a second memory element.

14. The method of claim 13, further comprising the following steps:

outputting the program current to the program terminal of the second memory element to modulate the threshold voltage of the second memory element and setting the program current with a constant value;

detecting the program voltage outputted by the second memory elements; and when the node voltage is higher than the reference voltage, stopping outputting the program current to the second memory element.

15. The method of claim 11, further comprising the following steps:

enabling a clamp voltage during programming the memory element.

* * * * *